(12) United States Patent
Patil et al.

(10) Patent No.: US 12,685,065 B2
(45) Date of Patent: Jul. 14, 2026

(54) UNIFIED RINSE AND DRY CLEANING APPARATUS AND METHODS

(71) Applicant: Yield Engineering Systems, Inc., Fremont, CA (US)

(72) Inventors: Arvind Patil, Bangalore (IN); Sanjay Kumar, Bangalore (IN); Harish Ravikumar, Bangalore (IN)

(73) Assignee: Yield Engineering Systems, Inc., Fremont, CA (US)

( * ) Notice: Subject to any disclaimer, the term of this patent is extended or adjusted under 35 U.S.C. 154(b) by 11 days.

(21) Appl. No.: 18/645,756

(22) Filed: Apr. 25, 2024

(65) Prior Publication Data

US 2025/0336692 A1 Oct. 30, 2025

(51) Int. Cl.
 B05B 1/14 (2006.01)
 H10P 72/00 (2026.01)

(52) U.S. Cl.
 CPC ............ H10P 72/0414 (2026.01); B05B 1/14 (2013.01)

(58) Field of Classification Search
 CPC .. H01L 21/67051; B05B 1/14; H10P 72/0414
 See application file for complete search history.

(56) References Cited

U.S. PATENT DOCUMENTS

| | | | |
|---|---|---|---|
| 4,670,317 A | 6/1987 | Greenway | |
| 2004/0050405 A1 | 3/2004 | Christenson et al. | |
| 2006/0174921 A1* | 8/2006 | Achkire | H01L 21/681 134/34 |
| 2006/0237033 A1 | 10/2006 | Yi et al. | |
| 2013/0283634 A1* | 10/2013 | Velazquez | H01L 21/67034 34/523 |
| 2019/0054508 A1 | 2/2019 | Randhawa | |

FOREIGN PATENT DOCUMENTS

| | | |
|---|---|---|
| JP | 2000-031108 A | 1/2000 |

OTHER PUBLICATIONS

International Search Report and Written Opinion in International Appln. No. PCT/US2025/025775, mailed on Aug. 6, 2025, 12 pages.
Invitation to Pay Additional Fees, And Where Applicable, Protest Fees in International Appln. No. PCT/US2025/025775, mailed on Jun. 5, 2025, 2 pages.
UniversityWafer.com [online], "The Cleaning of Silicon Wafers," available on or before Oct. 28, 2020, retrieved on Jan. 14, 2026, retrieved from URL<https://www.universitywafer.com/how-to-clean-silicon-wafers.html>, 8 pages.
Utmel.com [online], "Semiconductor Cleaning: Processes, Methods and Reasons," Apr. 20, 2022, retrieved on Jan. 14, 2026, retrieved from URL<https://www.utmel.com/blog/categories/semiconductor/semiconductor-cleaning-processes-methods-and-reasons>, 6 pages.

* cited by examiner

*Primary Examiner* — Erin F Bergner
(74) *Attorney, Agent, or Firm* — Fish & Richardson P.C.

(57) ABSTRACT

A cleaning apparatus incudes a plurality of tubes with angled orifices. An angled liquid stream is directed through the orifices to impinge on a surface of a substrate and clean the surface as the substrate moves in one direction through the space between a pair of tubes. An angled gas stream is then directed through the orifices to impinge on the surface of the substrate and dry the surface as the substrate moves in the opposite direction between the pair of tubes.

12 Claims, 4 Drawing Sheets

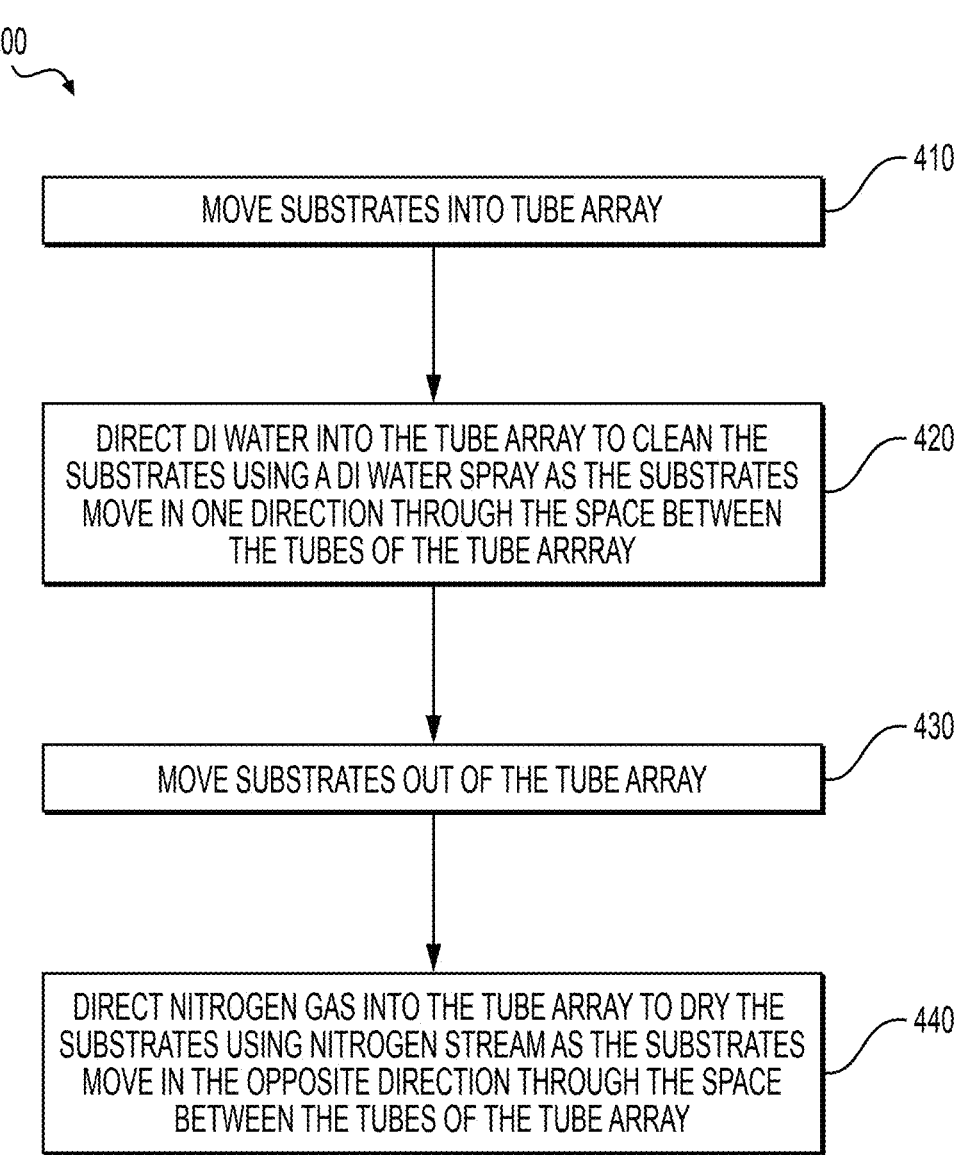

400

410
MOVE SUBSTRATES INTO TUBE ARRAY

420
DIRECT DI WATER INTO THE TUBE ARRAY TO CLEAN THE SUBSTRATES USING A DI WATER SPRAY AS THE SUBSTRATES MOVE IN ONE DIRECTION THROUGH THE SPACE BETWEEN THE TUBES OF THE TUBE ARRRAY

430
MOVE SUBSTRATES OUT OF THE TUBE ARRAY

440
DIRECT NITROGEN GAS INTO THE TUBE ARRAY TO DRY THE SUBSTRATES USING NITROGEN STREAM AS THE SUBSTRATES MOVE IN THE OPPOSITE DIRECTION THROUGH THE SPACE BETWEEN THE TUBES OF THE TUBE ARRAY

*FIG. 4*

UNIFIED RINSE AND DRY CLEANING APPARATUS AND METHODS

TECHNICAL FIELD

The present disclosure relates to cleaning apparatus and methods for cleaning semiconductor substrates.

BACKGROUND

Particulate contamination is a major cause of yield loss in a number of industries. Semiconductor manufacturing places perhaps the most stringent demands upon its cleaning processes (e.g., wafer cleaning). Particles on substrates (introduced by chemical reactions during processing, deposited via human or automated wafer handling, etc.) can affect down stream processing resulting in lower yields of electronic devices fabricated using these substrates. Cleaning electronic substrates using deionized (DI) water rinse followed by nitrogen ($N_2$) purge is a common practice in electronics manufacturing settings to remove contaminants. The substrate is dipped in a tank containing DI water to remove any remaining solvent or cleaning agents from previous steps. After DI water rinse, the substrate is placed in another tank, chamber, or enclosure where nitrogen gas is introduced to displace any remaining water and then purged out, carrying away any moisture or contaminants. This cleaning process helps to ensure the substrate is thoroughly clean before further processing. After cleaning, the substrate continues to the next process step. Electronic substrates may be cleaned in this matter at various stages (e.g., before processing, between two process steps, after processing, etc.) during semiconductor processing to ensure the quality and reliability of the devices being manufactured.

While DI water rinse and nitrogen purge is effective for cleaning substrates in many semiconductor processing applications, the current cleaning approach has some drawbacks. For example, it results in excess DI water usage and involves two sequential steps in two tanks, causing a notable drain on time and resources, especially for large-scale semiconductor manufacturing operations. The cleaning apparatus and methods of the current disclosure may alleviate at least some of the above-described issues.

SUMMARY

Several embodiments of devices and methods for cleaning a semiconductor substrate are disclosed. It is to be understood that both the foregoing general description and the following detailed description are exemplary and explanatory only. As such, the scope of the disclosure is not limited solely to the disclosed embodiments. Instead, it is intended to cover such alternatives, modifications and equivalents within the spirit and scope of the disclosed embodiments. Persons skilled in the art would understand how various changes, substitutions and alterations can be made to the disclosed embodiments without departing from the spirit and scope of the disclosure.

In one embodiment, an apparatus for cleaning one or more substrates is disclosed. The apparatus may include a tube array including a plurality of tubes spaced apart and arranged substantially parallel to each other, wherein a virtual plane extends through a center of each tube of the plurality of tubes. Each substrate of the one or more substrates may be configured to extend substantially perpendicular to the virtual plane to be disposed between a pair of adjacent tubes of the plurality of tubes. A plurality of orifices may be spaced apart from each other on each tube of the plurality of tubes. Each orifice of the plurality of orifices may be inclined with the virtual plane by an angle between about 30-60 degrees. A manifold may be configured to selectively direct a liquid or a gas to the plurality of tubes. The manifold may be configured to direct the liquid into the plurality of tubes to discharge a stream of the liquid through the plurality of orifices of the pair of adjacent tubes to impinge on opposite surfaces of the substrate positioned between the pair of adjacent tubes. The manifold may also be configured to direct the gas into the plurality of tubes to discharge a stream of the gas through the plurality of orifices of the pair of adjacent tubes to impinge on the opposite surfaces of the substrate positioned between the pair of adjacent tubes.

In another embodiment, a method of cleaning a plurality of substrates is disclosed. The method may include lowering the plurality of substrates such that each substrate of the plurality of substrates moves through a gap between a pair of tubes of a plurality of tubes. The method may also include discharging a liquid stream through a plurality of spaced apart orifices on each tube of the plurality of tubes to impinge on a surface of substrate at an angle between about of 30-60 degrees with the surface. The method may further include raising the plurality of substrates such that each substrate of the plurality of substrates moves through a gap between a pair of tubes of a plurality of tubes. The method may further include discharging a gas stream through the plurality of spaced apart orifices on each tube of the plurality of tubes to impinge on a surface of substrate at an angle between about of 30-60 degrees with the surface.

BRIEF DESCRIPTION OF THE DRAWINGS

The accompanying drawings, which are incorporated in and constitute a part of this disclosure, illustrate exemplary embodiments and, together with the description, are used to explain the disclosed principles. In these drawings, where appropriate, reference numerals illustrating like structures, components, materials, and/or elements in different figures are labeled similarly. It should be noted that the figures only depict some exemplary embodiments of the current disclosure and there can be many variations. The figures illustrate embodiments used to describe some features of the current disclosure. It is understood that various combinations of the structures, components, and/or elements, other than those specifically shown, are contemplated and are within the scope of the present disclosure. Specifically, the scope of the current disclosure is defined by the claims and not by the specific embodiments illustrated in the figures.

For simplicity and clarity of illustration, the figures depict the general structure of the various described embodiments. Details of well-known components or features may be omitted to avoid obscuring other features, since these omitted features are well-known to those of ordinary skill in the art. Further, elements in the figures are not necessarily drawn to scale. The dimensions of some features may be exaggerated relative to other features to improve understanding of the exemplary embodiments. One skilled in the art would appreciate that the features in the figures are not necessarily drawn to scale and, unless indicated otherwise, should not be viewed as representing proportional relationships between features in a figure. Additionally, even if it is not specifically mentioned, aspects described with reference to one embodiment or figure may also be applicable to, and may be used with, other embodiments or figures.

FIG. 4 is a flowchart depicting an exemplary method of cleaning substrates, consistent with some embodiments of the current disclosure.

DETAILED DESCRIPTION

Figure 1:
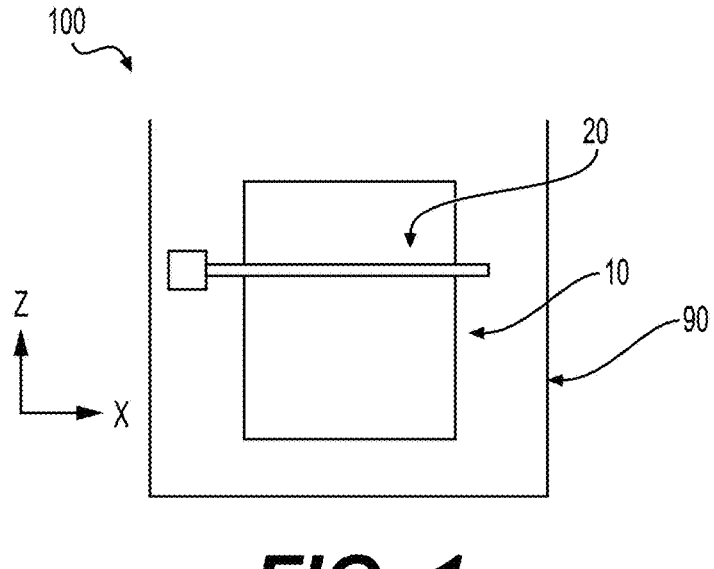
FIG. 1 is a schematic representation of an exemplary cleaning apparatus of the current disclosure.

All relative terms such as "about," "substantially," "approximately," etc., indicate a possible variation of +10% (unless noted otherwise or another variation is specified). For example, a feature disclosed as being about "t" units long (wide, thick, etc.) may vary in length from (t–0.1t) to (t+0.1t) units. In some cases, the specification also provides context to some of the relative terms used. For example, a structure described as being substantially parallel or substantially perpendicular may deviate slightly (e.g., 10% variation unless otherwise noted) from being perfectly parallel or perpendicular. Further, a range described as varying from, or between, 5 to 10 (5-10), includes the endpoints (i.e., 5 and 10).

Unless otherwise defined, all terms of art, notations, and other scientific terms or terminology used herein have the same meaning as is commonly understood by one of ordinary skill in the art to which this disclosure belongs. Some of the components, structures, and/or processes described or referenced herein are well understood and commonly employed using conventional methodology by those skilled in the art. Therefore, these components, structures, and processes will not be described in detail. All patents, applications, published applications and other publications referred to herein as being incorporated by reference are incorporated by reference in their entirety. If a definition or description set forth in this disclosure is contrary to, or otherwise inconsistent with, a definition and/or description in these references, the definition and/or description set forth in this disclosure controls over those in the references that are incorporated by reference. None of the references described or referenced herein is admitted as prior art to the current disclosure.

The term "substrate" is used broadly herein to refer to any integrated circuit (IC) device or optical device or component of these devices. For example, as used herein, a substrate may include a semiconductor wafer or a glass panel having opposite flat surfaces (e.g., a top/front surface and a bottom/back surface), a printed circuit board (PCB), an organic substrate, an electronic package with structures (e.g., IC die, pattern of circuits, etc.) thereon, an electronic device with circuits, an optical package, an optical device, or any other electronic or optical component or device. In some embodiments, the substrate being cleaned may be a semiconductor wafer or a panel between or after various stages of its fabrication (e.g., slice, laser mark, planarize, chemical mechanical polish (CMP), etc.). See, e.g., Cleaning Silicon Wafers for Research & Development, available at https://www.universitywafer.com/how-to-clean-silicon-wafers.html. In some embodiments, the substrate being cleaned may be a wafer or panel between or after different IC fabrication processes (deposition, etching, etc.). See, e.g., Semiconductor Cleaning: Processes, Methods and Reasons, available at https://www.utmel.com/blog/categories/semiconductor/semiconductor-cleaning-processes-methods-and-reasons. The removal of particles stuck, attached, adhered, redeposited, or otherwise disposed (in any manner) on a substrate surface is generally referred to herein as cleaning the surface.

Figure 2A:
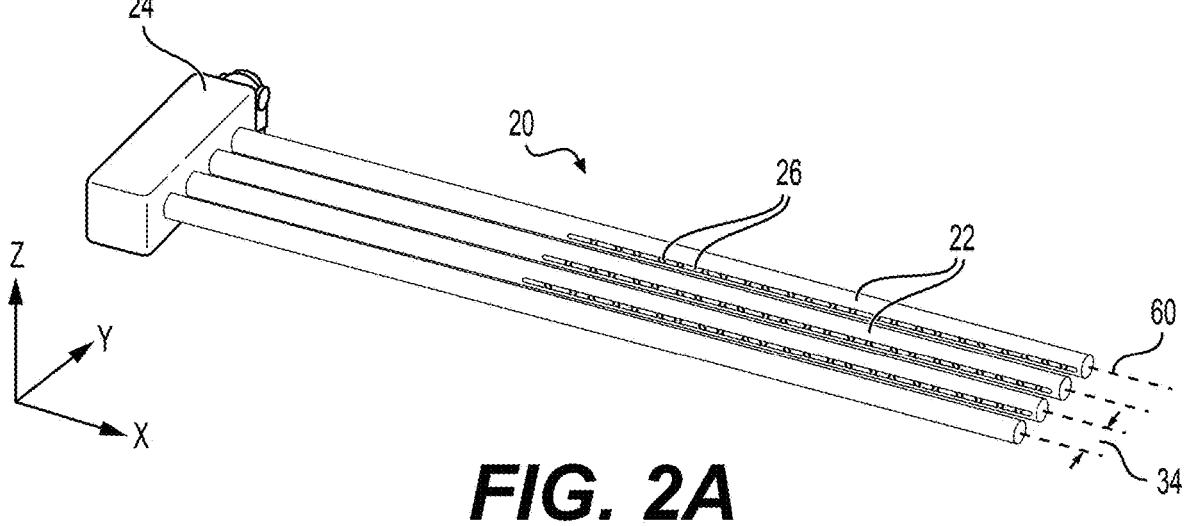
FIGS. 2A and 2B are different views of an exemplary tube array of the cleaning apparatus of FIG. 1.
Figure 2B:
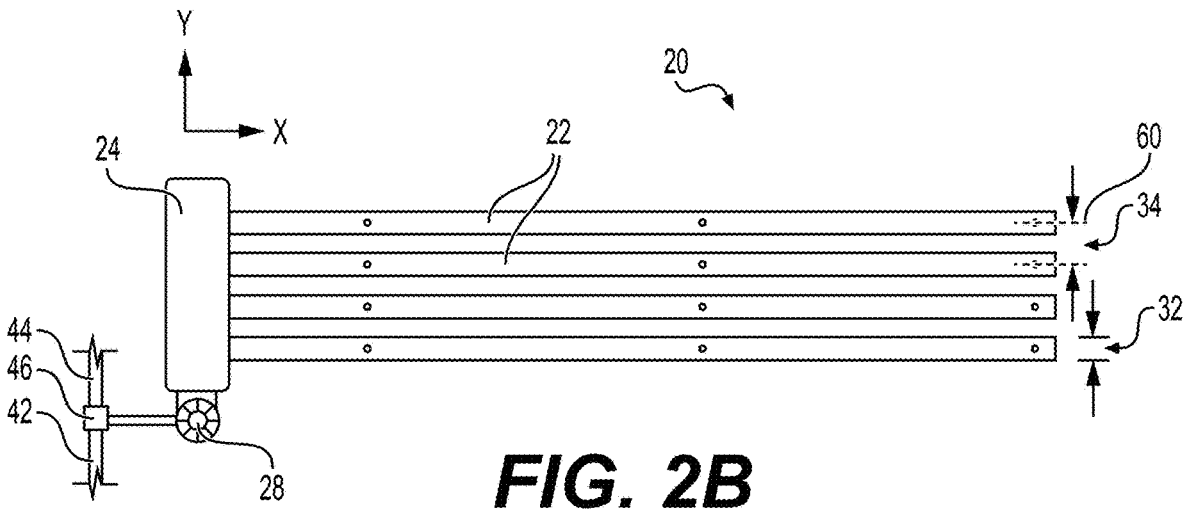

FIG. 1 is a schematic representation of an exemplary apparatus 100 (or system) for cleaning substrates 10. Cleaning apparatus 100 includes a tube array 20 with orifices (not shown in FIG. 1) configured to direct a liquid (e.g., DI water, cleaning solution, etc.) stream and a gas (e.g., N₂, inert gas, etc.) stream on to exposed surfaces of the substrates 10. Although not a requirement, in some embodiments, tube array 20 may be positioned in a tank or an enclosure 90 configured to drain the discharged liquid. FIGS. 2A-2C illustrate different views of an exemplary tube array 20. FIG. 2A illustrates a perspective view and FIG. 2B illustrates a bottom view of tube array 20. Tube array 20 may be made of any suitable material (such as, for example, PureBond, Polyvinylidene fluoride or polyvinylidene difluoride (PVDF), a metal, plastic, etc.). In the discussion that follows, reference will be made to FIGS. 2A and 2B.

Tube array 20 includes a plurality of elongate tubes 22 extending substantially parallel to each other from a manifold 24. Each tube 22 may have a cylindrical or tubular structure that is notably elongated along a longitudinal axis 60 (or length) of the tube 22. It should be noted that a cylindrical tube is merely exemplary. In general, tubes 22 may have any cross-sectional shape (e.g., rectangular, oval, etc.). Tubes 22 may be "substantially parallel" to each other. In other words, the longitudinal axes 60 of the tubes 22 may be close to being parallel, although they may not be perfectly parallel (e.g., due to imperfections and tolerances during fabrication and assembly). In practical terms, being substantially parallel indicates that the tubes 22 run in roughly the same direction with only minor deviations or variations in their alignment.

In general, tube array 20 may include any number or tubes 22 spaced apart from each other in a direction perpendicular to the length dimension or the longitudinal axis 60 of the tubes 22 (e.g., in the Y-direction in FIG. 2B). As schematically illustrated in FIG. 1, when a plurality of substrates 10 are being cleaned using apparatus 100, each substrate 10 is inserted between two adjacent tubes 22 of tube array 20 (see also FIG. 3A). Generally, the number of tubes 22 in tube array 20 may depend on the number of substrates 10 that will be cleaned at the same time using apparatus 100. For example, in some embodiments, if "n" substrates 10 will be cleaned at the same time, "n+1" tubes 22 may be provided such that each substrate 10 may be positioned between two adjacent tubes 22. In some embodiments, tube array 20 may include between 2-20 tubes.

With reference to FIG. 2A, each tube 22 of tube array 20 may include a plurality of orifices 26 spaced apart from each other along the length of tube 22 (e.g., along the X-direction in FIGS. 2A and 2B). Orifice 26 is a small opening, hole, or aperture through which a fluid (e.g., gas or liquid) can pass. In some embodiments, each orifice 26 may include a nozzle (not shown). Nozzle is a device or a structure configured to control the direction, speed, or flow of the fluid. In some embodiments, the nozzle may include a passage which narrows or expands at certain points to accelerate or decelerate the fluid flowing through it alter its characteristics. As best seen in FIG. 2A (and FIG. 3B), orifices 26 may be provided on the side(s) of each tube 22 that faces an adjacent tube 22 such that the orifices 26 on each tube 22 faces an adjacent tube 22. In some embodiments, the orifices 26 of adjacent tubes 22 may face each other. In some embodiments, the inner tubes 22 of a tube array 20 may include orifices 26 on opposite sides of the tube 22, while its outer tubes 22 may only have orifices 26 on the side of the outer tube 22 that faces an adjacent tube 22 (see FIG. 3A).

In general, each tube 22 may have any diameter 32 (see FIG. 2B). In some embodiments, the diameter 32 of the tubes 32 may be between about x-y mm. Although not a requirement, in some embodiments, each tube 22 of tube array 20 may have the same diameter. In some embodiments, diameter 32 of each tube 22 may be between about x1-y1 mm. The pitch 34 of the tubes 22 (e.g., center-center spacing or the distance between the longitudinal axes 60 of adjacent tubes 22) of tube array 20 may depend on the thickness of the substrate 10. In general, a substrate 10 have any suitable thickness (e.g., such that they are relatively rigid) may be cleaned using apparatus 100. In some embodiments, the thickness of the substrates 10 that may be cleaned using apparatus 100 may be between about 0.2-4 mm. In some embodiments, to accommodate substrates 10 of different thicknesses, the pitch 34 between tubes 22 may be between about 0.75-2 inches (e.g., between about 19-50 mm). In some embodiments, the pitch 34 may be about 1.5 inches (e.g., about 38.1 mm).

Figure 3A:
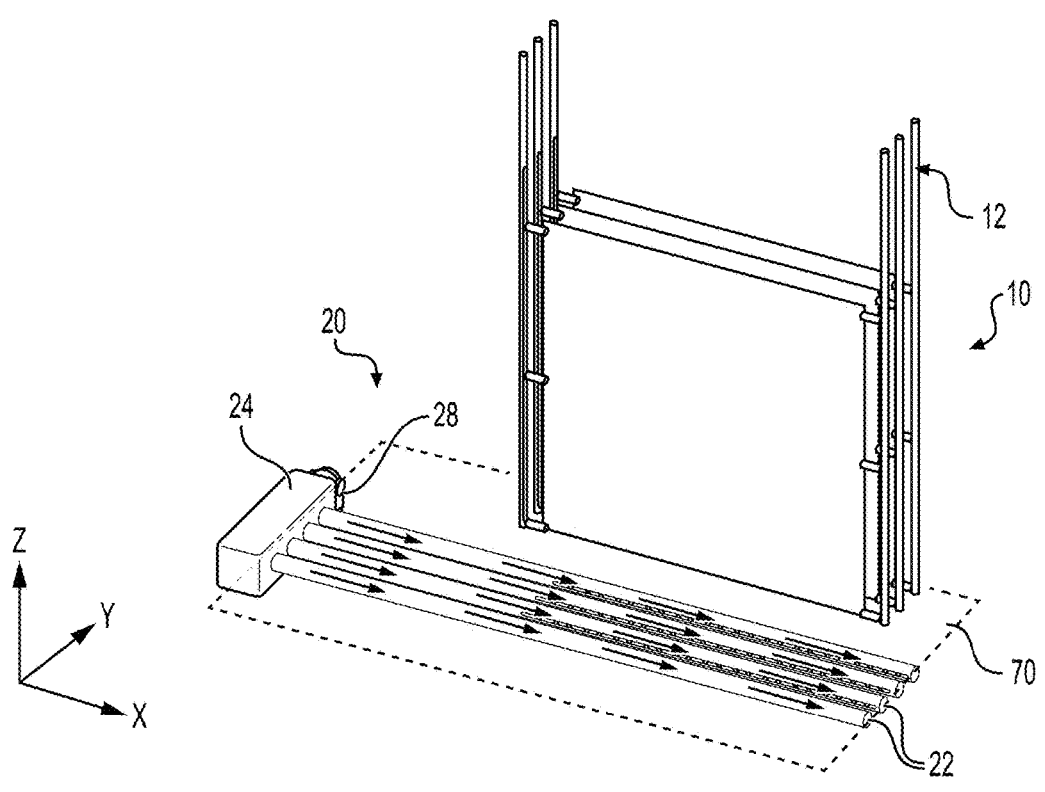
FIG. 3A is a schematic illustration of multiple substrates positioned to be cleaned using the apparatus of FIG. 1, consistent with some embodiments of the current disclosure.

Any number of substrates 10 (e.g., 1-100 substrates) may be cleaned at the same time using apparatus 100. To clean the substrates using apparatus 100, each substrate 10 is disposed in the space between two adjacent tubes 22. In some embodiments, as illustrated in FIG. 3A, a substrate carrier 12 may support multiple substrates 10 such that adjacent substrates 10 are spaced apart from each other. Substrate carrier 12 may be a structure with slots or pockets where individual substrates 10 may be placed. Carrier 12 may also have spring-loaded clamps, grooves, or other mechanisms to safely hold the substrates 10 in place and prevent them from moving or getting damaged during handling and cleaning processes. Carrier 12 may securely hold the multiple substrates 10 simultaneously during various processing steps, including cleaning, and transport the substrates 10 between different processes.

Figure 3B:
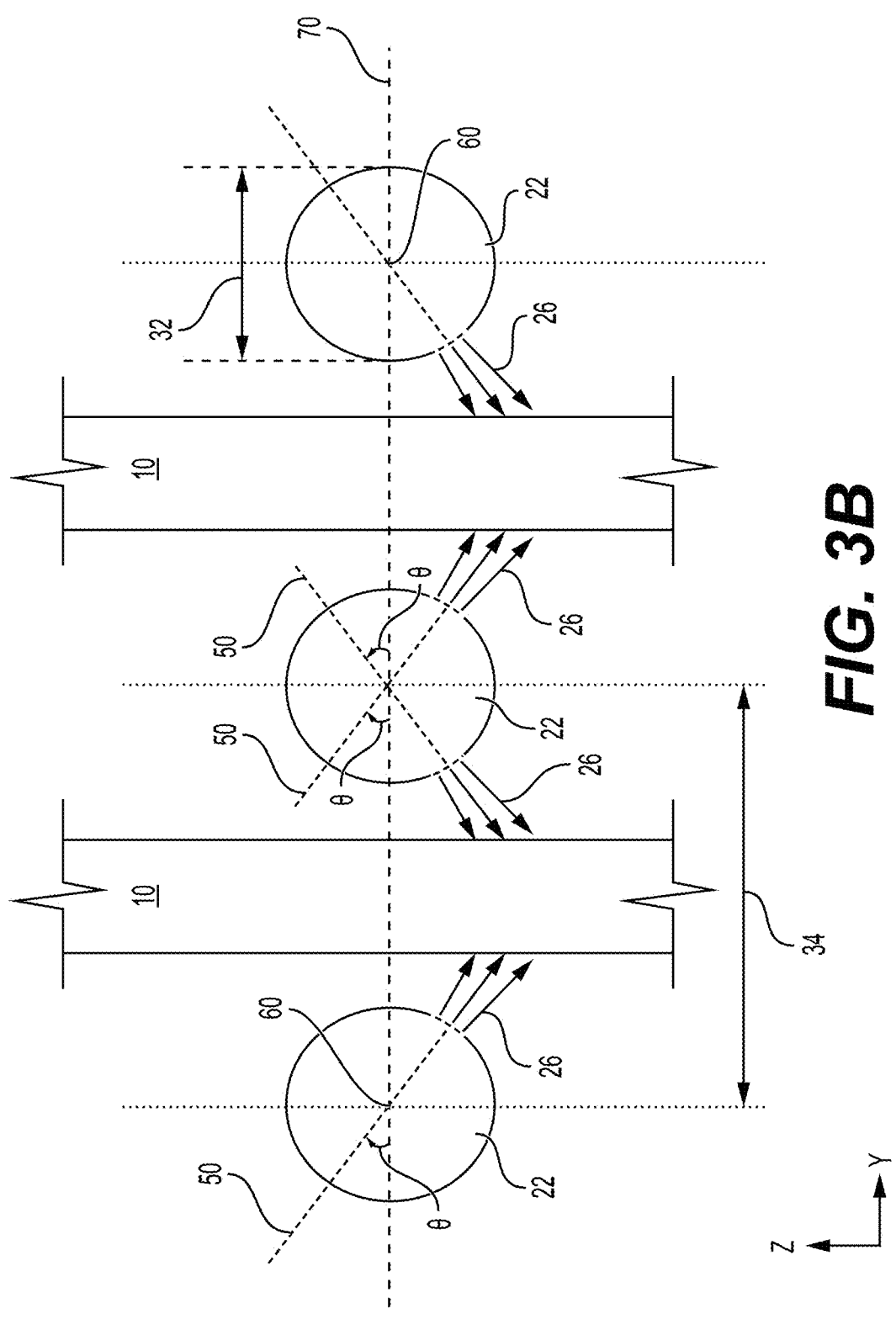
FIG. 3B is a schematic illustration of a pair of substrates being cleaned in the apparatus of FIG. 1, consistent with some embodiments of the current disclosure.

As best seen in FIG. 3A, to simultaneously clean multiple substrates 10, the carrier 12 (supporting the multiple substrates 10) is aligned with the tubes 22 of tube array 20, and the carrier 12 is lowered such that each substrate 10 is disposed between two adjacent tubes 22 (see FIG. 3B). For example, the carrier 12 is first arranged such that the substrates 10 are spaced apart in the same direction as the tubes 22 and each substrate 10 is positioned above the gap between adjacent tubes 22, and the carrier 12 is then lowered such that the substrates are inserted between the tubes 22. With reference to FIGS. 3A and 3B, in some embodiments, the substrate carrier 12 may be aligned such that the opposite surfaces (e.g., front and back surfaces) of the substrates 10 extend substantially parallel to the longitudinal axis 60 of the tubes 22. It should be noted that although a square panel is illustrated as the substrate in FIG. 3A, this is merely exemplary. As previously mentioned, substrate 10 may have any shape and configuration (e.g., a rectangular panel, a circular wafer, etc.).

When the substrates 10 are positioned between the tubes 22 (see FIG. 3B), a cleaning solution (DI water, solvent, chemical mixture, etc.) discharged under pressure through the orifices 26 impact the exposed front and back surfaces of the substrates 10 to clean them. These orifices 26 may be strategically positioned on the tubes 22 to direct jets or sprays of the cleaning solution on the surfaces of the substrates 10. As the cleaning solution exits an orifice 26 (of tube 22) and impacts the surface of the substrate 10, it may dislodge and wash away contaminants or residues present on the surface. The high-velocity stream of the cleaning solution may also create a mechanical scrubbing effect on the substrate surface, effectively loosening and removing particles, films, or organic substances that may be adhered to the surface. In some embodiments (e.g., when a chemical is used as the cleaning solution), the solutions kinetic energy and chemical properties may work together to clean the surface. Depending on the nature of the cleaning solution, chemical reactions may occur between the solution and the contaminants on the surface, to dissolve or breakdown the residues on the substrate surface.

The orifices 26 on tube 22 are arranged to ensure uniform coverage of the substrate surfaces. Although the exact number and pitch of the orifices 26 may depend on the application (e.g., size of substrate, etc.), the orifices 26 are arranged such that the cleaning solution exiting these orifices uniformly impinge on all areas of the substrate surface. In some embodiments, the number of orifices 26 on each tube 22 may vary between a-b, and their pitch may vary between 6-12 mm. The size of each orifice 26 may be configured such that the pressure of the cleaning solution exiting the orifice 26 is sufficient to clean the substrate surface without damaging it. In some embodiments, each orifice 26 may have a diameter between about 0.5-2 mm. In an exemplary embodiment, when a 200×200 mm panel is being cleaned, a tube 22 having ten, approximately 0.5 mm diameter orifices 26, at a pitch of about 0.5 mm may be used. In another embodiment, for a 275×275 mm panel, thirty six orifices having a diameter of about 1 mm at a pitch of about 7.5 mm may be used.

As illustrated in FIG. 3B, the tubes 22 of the tube array 20 are oriented substantially parallel to each other and aligned along a common virtual plane 70 (XY plane). In other words, the longitudinal axes 60 of the tubes 22 may be coplanar and lie on virtual plane 70. In some embodiments, the substrates 10 may be disposed between the tubes 26 such that they extend substantially perpendicular to virtual plane 70 (e.g., the XY plane). In some embodiments, the orifices 26 on each tube 26 may be positioned on the virtual plane 70 (e.g., orifices 26 may be coplanar with the virtual plane) such that a direct perpendicular stream emanates from the orifices 26 to impinge on the substrate surface.

In some embodiments, as illustrated in FIG. 3B, each orifice 26 may make an angle θ with the virtual plane 70. In other words, the orifices 26 may be inclined with the virtual plane 70 by an angle θ. In some embodiments, angle θ may vary between about 30-60 degrees. In some embodiments, angle θ may be about 45°. Each orifice 26 on the tube wall may be inclined such that a fluid stream ejected from the orifice 26 impinges on a surface of the substrate positioned beside the tube 22 at an angle rather than perpendicularly. In some embodiments, orifice 26 may be angle-drilled hole. In general, each orifice 26 may have any shape. In some embodiments, each orifice 26 may have a circular shape.

When an orifice 26 is angled (e.g., between 30-60° relative to the virtual plane 70), the fluid stream from orifice 26 impacts the substrate surface at oblique angle (e.g., between 30-60°) and make cleaning more effective than a direct perpendicular stream. For example, the angled impact may help dislodge contaminants more effectively by providing a sweeping or shearing action across the surface. Moreover, an angled stream can cover a wider area of the surface compared to a straight-on stream. The impact of the liquid at an angle can also reach into crevices, corners, and other uneven areas of a patterned surface that might be missed by a perpendicular stream. The angled stream may also be more effective in carrying away the dislodged contaminants more effectively, reducing the risk of them settling back onto the cleaned area. Angled streams may provide effective cleaning while minimizing the risk of surface damage. For example, compared to a high-pressure perpendicular stream that might cause erosion or abrasion, an angled stream can achieve cleaning with gentler mechanical action. Furthermore, by adjusting the angle of the stream (e.g., by varying angle θ), the direction and force of the impact can be controlled allowing for tailored cleaning approaches based on the nature of the surface and the type of contaminants being addressed.

In the embodiment illustrated in FIG. 3A, the tube array 20 is arranged horizontally (e.g., virtual plane 70 is a horizontal XY plane) and the substrates 10 are arranged vertically (e.g., along the XZ plane). In such an embodiment, the substrates 10 are lowered (e.g., moved vertically) into the tube array 20 (e.g., such that each substrate 10 is inserted into the space between two adjacent tubes 22) for cleaning and raised from the tube array 20 after cleaning. However, this is only exemplary. In some embodiments, the tube array 20 may be arranged vertically and the substrates 10 may be arranged horizontally. In such embodiments, the substrates 10 may be moved sideways in one direction to insert into the tube array 10 and moved sideways in the opposite direction to remove it from the tube array 20. In some embodiments, in addition to, or as an alternative to, moving the substrates 10 towards and away from the tube array 20, the tube array 20 may be moved towards and away from the substrates 10.

As best seen in FIGS. 2B, the multiple tubes 22 of tube array 20 may be connected to a common manifold 24 having a fluid connection 28. Manifold 24 may be configured to selectively direct a liquid or a gas to the plurality of tubes 22 of tube array 20. In some embodiments, manifold 24 may be include or be coupled to valves, switches, or other flow control mechanisms that can direct either the liquid or the gas towards the tubes 22. The fluid connection 28 may be connected a liquid conduit 42 and a gas conduit 44 through a control valve 46. The liquid conduit 42 may be configured to a direct a liquid (e.g., DI water or another suitable liquid) into the tube array 20 (via manifold), and the gas conduit 44 may be configured to direct a gas (e.g., nitrogen or another inert gas) into the tube array 20. The control valve 46 may selectively direct the liquid or the gas into the tube array 20. For example, the control valve 46 may be activated to direct one of the liquid or the gas to the tube array 20. In some embodiments, the liquid and/or the gas may be directed in tube array 20 under pressure. The high pressure liquid exits through the orifices 26 of the tubes 22 as a liquid stream (or a liquid jet) and impinge on the substrate surfaces to clean these surfaces. It should be noted that, apparatus 100 may also include other valves and fluidic devices to control the liquid and gas supply to tube array 20. Since these valves and devices are well known in the art, they are not shown in the figures or discussed herein.

In apparatus 100, tube array 20 is fluidly coupled to both a liquid (e.g., DI water, a cleaning solution, liquid chemical, etc.) supply and a gas (e.g., N₂, an inert gas, etc.) supply to selectively direct the liquid or the gas into the tube array 20. For example, a liquid (e.g., DI water) may be first directed to the tube array 20 (e.g., via liquid conduit 42) to clean (or wash) the substrate surface using a stream of DI water emanating from orifices 26. Thereafter, the flow of DI water into tube array 20 may be stopped (e.g., by activating control valve 46), and nitrogen gas (heated nitrogen gas, in some embodiments) may be directed into the tube array 20 (e.g., via gas conduit 44) to dry the cleaned substrate surfaces using the nitrogen stream from the orifices 26. The nitrogen stream may remove residual water and contaminants from the surfaces following the liquid cleaning. The angled stream of nitrogen exiting the angled orifices 26 may more effectively (than a perpendicular stream) sweep away any remaining liquid droplets and moisture from the surface, leaving it dry and free from liquid spots or residues.

With reference to FIG. 3A, in some embodiments, DI water may be directed into the tube array 20 when the substrates 10 are lowered into (or moved sideways into) the tube array 20 such that the stream of DI water exiting the orifices 26 impinge on and clean the substrate surfaces as the substrates 10 move downward through the space between the tubes 22. Although not a requirement, in some embodiments, to avoid wastage of DI water, DI water supply to the tube array 20 may be initiated when the bottom region (the bottom-most end, in some embodiments) of the substrates 10 enter the space between the tubes 22. The DI water supply may be stopped when the top region (the top-most end, in some embodiments) of the substrates 10 enters or reaches the space between the tubes 22. In some embodiments, DI water supply to tube array 20 may be stopped after a predetermined time (e.g., 1-10 minutes, etc.) after the top region of the substrates 10 enters the space between the tubes 22. In some embodiments, this pause may be eliminated.

The substrates 10 may then be raised up from (or moved out of) the tube array 20. Nitrogen (or another inert gas) supply to the tube array 20 (e.g., via gas conduit 44) may be initiated as the substrates 10 are raised up from the tube array 20 such that the stream of nitrogen gas exiting the orifices 26 and impinging on the cleaned substrate surfaces dry these surfaces as the substrates 10 are removed from tube array 20. Although not a requirement, in some embodiments, to avoid wastage of nitrogen, nitrogen supply to the tube array 20 may be initiated as the substrates 10 begin moving up and the nitrogen supply may be stopped when the bottom region (the bottom-most end, in some embodiments) of the substrates 10 move up from the space between the tubes 22 of tube array 20. In some embodiments, heated nitrogen gas (or another suitable gas) may be supplied to the tube array 20 to dry the substrates 10.

FIG. 4 illustrates an exemplary method 400 of cleaning substrates 10 using apparatus 100. In step 410, the substrates 10 may be moved (downwards, sideways, etc.) into the tube array 20. As the substrates 10 move into the tube array 20, each substrate 10 moves through the space between two adjacent tubes 22 of the tube array 20. In step 420, DI water (or another suitable liquid) may be directed into the tube array 20 such that the stream of DI water exiting the orifices 26 of the tubes 22 impinge on and clean the substrate surfaces as the substrates move into the tube array 20. After cleaning the substrate surfaces, the DI water supply to the tube array 20 may be stopped. In step 430, the substrates 10 may be moved out of the tube array 20. In step 440, nitrogen gas (or another suitable gas) may be directed into the tube array 20 such that the stream of nitrogen gas exiting the orifices 26 impinge on and dry the cleaned substrate surfaces as the substrates 10 move out of the tube array 20. In some embodiments, heated nitrogen gas may be directed into the tube array 20. The nitrogen supply to the tube array 20 may then be stopped.

Method 400 is only exemplary and many variations are possible. For example, the illustrated steps need not be performed in the illustrated order. As another example, some of the illustrated steps may be combined or may be eliminated. In some embodiments, additional steps may also be added. It is also contemplated that method 400 may be combined with and incorporated in another process.

The apparatus of the current disclosure incorporates both the cleaning/rinsing step and the drying step in a single apparatus (or device) thereby eliminating the need for two different tanks and process steps. Consolidating the cleaning and drying functions into a single apparatus simplifies the semiconductor processing workflow resulting in faster turn-around time and increasing productivity. Moreover, the disclosed apparatus also reduces the volume of DI water required for the cleaning process compared to current cleaning methods resulting in cost savings.

It should be noted that although an apparatus 100 with a tube array 20 configured to clean multiple substrates 10 is described above, this is only exemplary. In some embodiments, an apparatus of the current disclosure may be used to clean a single substrate. For example, an exemplary cleaning apparatus may include a pair of tubes 22 with spaced-apart orifices 26, and the single substrate 10 may pass though the space between the pair of tubes 22. As the substrate 10 moves in one direction (downwards, sideways, etc.) between the tubes 22, a stream of DI water (or another suitable liquid) emanating from the angled orifices 26 of the tubes impinge on the front and back surfaces of the substrate 10 to clean it. And as the substrate 10 moves in the opposite direction, a stream of nitrogen gas emanating from these orifices 26 impinge on and dry the cleaned substrate surfaces.

It should also be noted that although an apparatus 100 with a tube array 20 including multiple tubes 22 spaced apart (e.g., in the Y direction) and arranged on one plane (e.g., in the XY plane) is described (see FIG. 3A), this is only exemplary. In some embodiments, an apparatus of the current disclosure may include multiple tubes 22 spaced apart in two orthogonal directions (e.g., in the Y and Z direction of FIG. 3A). For example, a first plurality of tubes may be spaced apart in the Y direction and arranged on one XY plane (e.g., as shown in FIG. 3A), and a second plurality of tubes may be spaced apart in the Y direction and arranged on a second XY plane spaced apart in the Z direction from the first XY plane. As described with reference to apparatus 100 of FIG. 3A, the tubes may include angled orifices that spray both a liquid to clean the substrate surfaces and a gas to dry the substrate surfaces after cleaning.

A person of ordinary skill in the art would recognize that although exemplary embodiments of cleaning apparatuses and cleaning methods are disclosed, the scope of the current disclosure encompasses many variations in the apparatus and the methods. Furthermore, although the process of cleaning a substrate is described, embodiments of the current disclosure may be used to clean any part.

What is claimed is:

1. An apparatus for cleaning one or more substrates, comprising:
   a tube array including a plurality of tubes spaced apart and arranged substantially parallel to each other, wherein a virtual plane extends through a center of each tube of the plurality of tubes, and wherein each substrate of the one or more substrates is configured to extend substantially perpendicular to the virtual plane to be disposed between a pair of adjacent tubes of the plurality of tubes;
   a plurality of orifices spaced apart from each other on each tube of the plurality of tubes, wherein each orifice of the plurality of orifices is inclined with the virtual plane by an angle between about 30-60 degrees;
   a manifold configured to direct a liquid or a gas to the plurality of tubes;
   a control valve;
   a liquid conduit configured to direct the liquid to the control valve; and
   a gas conduit, distinct from the liquid conduit, configured to direct the gas to the control valve,
   wherein the control valve is fluidically connected between the manifold, the liquid conduit, and the gas conduit, the control valve configured to selectively direct the liquid from the liquid conduit or the gas from the gas conduit to the manifold, wherein the manifold is configured to:
      direct the liquid into the plurality of tubes to discharge a stream of the liquid through the plurality of orifices of the pair of adjacent tubes to impinge on opposite surfaces of the substrate positioned between the pair of adjacent tubes, and
      direct the gas into the plurality of tubes to discharge a stream of the gas through the plurality of orifices of the pair of adjacent tubes to impinge on the opposite surfaces of the substrate positioned between the pair of adjacent tubes.

2. The apparatus of claim 1, wherein the stream of liquid discharged from each orifice of the plurality of orifices impinges on the opposite surfaces of the substrate at an angle between about 30-60 degrees with the opposite surfaces.

3. The apparatus of claim 1, wherein each orifice of the plurality of orifices is inclined with the virtual plane by an angle of about 45 degrees.

4. The apparatus of claim 1, wherein the plurality of tubes include 2-20 tubes.

5. The apparatus of claim 1, wherein each orifice of the plurality of orifices has a diameter between about 0.5-2 mm.

6. The apparatus of claim 1, wherein a pitch of the plurality of orifices on each tube of the plurality of tubes is between about 6-12 mm.

7. The apparatus of claim 1, wherein a pitch of the plurality of tubes is between about 19-50 mm.

8. The apparatus of claim 1, wherein the liquid is DI water.

9. The apparatus of claim 1, wherein the gas is nitrogen.

10. The apparatus of claim 1, wherein each tube of the plurality of tubes is an elongated tube that extends along a length of the tube, and the plurality of orifices on each tube are spaced apart along the length of the tube.

11. The apparatus of claim 1, comprising:
   a supply of the liquid fluidically connected to the liquid conduit; and
   a supply of the gas fluidically connected to the gas conduit.

12. The apparatus of claim 11, wherein the supply of the gas comprises a supply of heated nitrogen gas.

* * * * *